US011052647B2

(12) United States Patent
Findley

(10) Patent No.: US 11,052,647 B2
(45) Date of Patent: Jul. 6, 2021

(54) DIRECT ADDITIVE SYNTHESIS OF DIAMOND SEMICONDUCTOR

(71) Applicant: Lockheed Martin Corporation, Bethesda, MD (US)

(72) Inventor: David Glen Findley, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 581 days.

(21) Appl. No.: 15/976,753

(22) Filed: May 10, 2018

(65) Prior Publication Data

US 2019/0346828 A1 Nov. 14, 2019

(51) Int. Cl.
  *B33Y 10/00* (2015.01)
  *H01L 21/02* (2006.01)
  (Continued)

(52) U.S. Cl.
  CPC .............. *B33Y 10/00* (2014.12); *C30B 7/14* (2013.01); *H01L 21/02104* (2013.01);
  (Continued)

(58) Field of Classification Search
  CPC ......... B01J 21/18; B01J 35/004; B28B 1/001; B29C 64/106; B33Y 10/00; B33Y 30/00;
  (Continued)

(56) References Cited

U.S. PATENT DOCUMENTS 5,053,434 A * 10/1991 Chapman ............... C08G 73/02
  521/52
5,436,315 A 7/1995 Rieke
  (Continued)

FOREIGN PATENT DOCUMENTS

CN 105788891 7/2016
CN 106449809 A 2/2017
  (Continued)

OTHER PUBLICATIONS

Extended European Search Report for corresponding European Application No. 19173736.0, dated Sep. 11, 2019.
  (Continued)

*Primary Examiner* — Benjamin A Schiffman
(74) *Attorney, Agent, or Firm* — Baker Botts L.L.P.

(57) ABSTRACT

In an embodiment, a system includes a three-dimensional (3D) printer, a neutral feedstock, a p-doped feedstock, an n-doped feedstock, and a laser. The 3D printer includes a platen and an enclosure. The platen includes an inert metal. The enclosure includes an inert atmosphere. The neutral feedstock is configured to be deposited onto the platen. The neutral feedstock includes a halogenated solution and a nanoparticle having a negative electron affinity. The p-doped feedstock is configured to be deposited onto the platen. The p-doped feedstock includes a boronated compound introduced to the neutral feedstock. The n-doped feedstock is configured to be deposited onto the platen. The n-doped feedstock includes a phosphorous compound introduced to the neutral feedstock. The laser is configured to induce the nanoparticle to emit solvated electrons into the halogenated solution to form, by reduction, layers of a ceramic comprising a neutral layer, a p-doped layer, and an n-doped layer.

7 Claims, 7 Drawing Sheets

(51) Int. Cl.
*C30B 7/14* (2006.01)
*H01L 23/15* (2006.01)
*B33Y 30/00* (2015.01)
*C30B 29/36* (2006.01)
*C30B 29/04* (2006.01)
*B28B 1/00* (2006.01)
*B33Y 70/00* (2020.01)
*C01B 32/26* (2017.01)
*C09D 11/037* (2014.01)
*C01B 32/963* (2017.01)
*C09D 11/033* (2014.01)
*C01B 32/05* (2017.01)

(52) U.S. Cl.
CPC ........ *H01L 21/02628* (2013.01); *H01L 23/15* (2013.01); *B28B 1/001* (2013.01); *B33Y 30/00* (2014.12); *B33Y 70/00* (2014.12); *C01B 32/05* (2017.08); *C01B 32/26* (2017.08); *C01B 32/963* (2017.08); *C04B 2235/6026* (2013.01); *C09D 11/033* (2013.01); *C09D 11/037* (2013.01); *C30B 29/04* (2013.01); *C30B 29/36* (2013.01)

(58) Field of Classification Search
CPC .......... B33Y 70/00; B41J 3/407; C01B 32/05; C01B 32/26; C01B 32/963; C04B 2111/00181; C04B 2235/6026; C09D 11/033; C09D 11/037; C30B 7/14; C30B 29/04; C30B 29/36; C30B 30/00; H01L 21/02104; H01L 21/02628; H01L 23/15; H05K 3/125; G05B 2219/49023; G05B 19/4099
See application file for complete search history.

(56) References Cited

U.S. PATENT DOCUMENTS

| | | | | |
|---|---|---|---|---|
| 5,463,018 | A * | 10/1995 | Rieke | C08G 61/02 528/373 |
| 5,516,884 | A | 5/1996 | Bianconi | |
| 6,217,816 | B1 | 4/2001 | Tang | |
| 7,547,358 | B1 | 6/2009 | Shapiro | |
| 8,013,109 | B2 * | 9/2011 | Toppare | C08G 61/02 528/397 |
| 8,252,253 | B2 | 8/2012 | Sung | |
| 9,035,017 | B2 * | 5/2015 | Berrang | C25B 11/04 528/397 |
| 19,035,017 | | 5/2015 | Berrang | |
| 9,302,945 | B2 * | 4/2016 | Findley | C04B 35/524 |
| 9,402,322 | B1 | 7/2016 | Findley | |
| 9,643,361 | B2 | 5/2017 | Liu | |
| 9,969,930 | B2 * | 5/2018 | Florio | C09K 8/80 |
| 10,577,249 | B2 * | 3/2020 | Findley | C01B 33/021 |
| 2006/0115772 | A1 * | 6/2006 | Hah | C08G 61/02 430/311 |
| 2017/0008236 | A1 | 1/2017 | Easter et al. | |
| 2017/0120336 | A1 | 5/2017 | DeMuth et al. | |
| 2017/0189965 | A1 | 7/2017 | Vaidya et al. | |
| 2017/0297109 | A1 | 10/2017 | Gibson et al. | |
| 2019/0344470 | A1 * | 11/2019 | Findley | C01B 32/05 |
| 2019/0375007 | A1 * | 12/2019 | Findley | C04B 35/5626 |

FOREIGN PATENT DOCUMENTS

| | | |
|---|---|---|
| EP | 3009416 A1 | 4/2016 |
| JP | 2004077747 | 3/2004 |

OTHER PUBLICATIONS

Hengbo Yin et al. "Photoreductive Dehalogenation of Halogenated Benzene Derivatives Using ZnS or CdS Nanocrystallites as Photocatalysts", Environmental Science & Technology, vol. 35, No. 1, Jan. 1, 2001 (Jan. 1, 2001), pp. 227-231, XP055617142, UA ISSN: 0013-936X, DOI:10.1021/es001114d.

Drummond, et al. "Electron Emission from Diamondoids: A Diffusion Quantum Monte Carlo Study", Physical Review Letters, PRL 95, 096801 (2005), pp. 096801-1 thru 096601-4, Week ending Aug. 26, 2005.

Chun-Xiang Zhao, et al. "$H^{18}$ Carbon: A New Metallic Phase with $sp^2$-$sp^3$ Hybridized Bonding Network", Scientific Reports, 9 pps, Published Feb. 23, 2016.

Zak C. Eckel, et al. Supplemental Materials for "Additive manufacturing of polymer-derived ceramics", Science AAas, 10 pps. published Jan. 1, 2015.

Patricia A. Bianconi, et al. "Diamond an Diamond-Like Carbon from a Preceramic Polymer", JACS Articles, pp. 3191-3202, published on the web Feb. 24, 2004.

Eung Joon Chi, et al, "Fabrication of amorphous-carbon-nitride field emitters", Applied Physics Letters, coves sheets plus pp. 324-326, Jul. 21, 1997.

H. Yamaguchi, et al. "Electron emission from conduction band of diamond with negative electron affinity", vol. 80 Issue 16 of Physical Review B, 13 pp. published Oct. 15, 2009.

M. J. Powers, et al. "Observation of a negative electron affinity for boron nitride", Appl. Phys. Letter 67 (26), pp. 3912-3914, Dec. 25, 1995.

Christoph E. Nebel, "A Source of energetic electrons" Nature Materials, vol. 12, pp. 780-781, Sep. 2013.

Di Zhu, et al. "Photo-illuminated diamond as a solid-state source of solvated electrons in water for nitrogen reduction", Nature Materials, vol. 12, pp. 836-841, Sep. 2013.

* cited by examiner

DIRECT ADDITIVE SYNTHESIS OF DIAMOND SEMICONDUCTOR

TECHNICAL FIELD

The present disclosure relates generally to three-dimensional (3D) printing, and in particular to 3D printing of a ceramic semiconductor.

BACKGROUND

Three-dimensional (3D) printing is an additive manufacturing process that allows for the manufacture of objects by "building up" an object. In contrast to subtractive techniques, such as machining, in which material is removed from a bulk material in order to form the shape of an object, 3D printing lays down successive layers of material to form the shape of an object. Typical materials used for 3D printing may include plastics, ceramics, and metals.

SUMMARY

According to some embodiments, a system includes a three-dimensional (3D) printer, a neutral feedstock, a p-doped feedstock, an n-doped feedstock, and a laser. The three-dimensional (3D) printer includes a platen and an enclosure. The platen includes an inert metal. The enclosure includes an inert atmosphere. The neutral feedstock is configured to be deposited onto the platen. The neutral feedstock includes a halogenated solution and a nanoparticle having a negative electron affinity. The p-doped feedstock is configured to be deposited onto the platen. The p-doped feedstock includes a boronated compound introduced to the neutral feedstock. The n-doped feedstock is configured to be deposited onto the platen. The n-doped feedstock includes a phosphorous compound introduced to the neutral feedstock. The laser is configured to induce the nanoparticle to emit solvated electrons into the halogenated solution to form, by reduction, layers of a ceramic comprising a neutral layer, a p-doped layer, and an n-doped layer.

In other embodiments, a method for additive manufacture includes introducing a boronated compound to a second neutral feedstock to form a p-doped feedstock, wherein the neutral feedstock includes a halogenated solution and a nanoparticle having a negative electron affinity. The method further includes introducing a phosphorous compound to a third neutral feedstock to form an n-doped feedstock. The method also includes depositing a first layer of a third neutral feedstock onto a platen of a three-dimensional (3D) printer. The method further includes inducing the nanoparticle of the third neutral feedstock to emit solvated electrons into the halogenated solution using a laser to form, by reduction, a first layer of a neutral ceramic. The method also includes depositing a second layer of the p-doped feedstock onto the platen of the three-dimensional (3D) printer. The method further includes inducing the nanoparticle of the p-doped feedstock to emit solvated electrons into the halogenated solution using a laser to form, by reduction, a second layer of a p-doped ceramic. The method also includes depositing a third layer of the n-doped feedstock onto the platen of the three-dimensional (3D) printer. The method further includes inducing the nanoparticle of the n-doped feedstock to emit solvated electrons into the halogenated solution using a laser to form, by reduction, a third layer of n-doped ceramic.

In yet other embodiments, a three-dimensional (3D) printer includes an inert atmosphere, a platen, and a control unit. The inert atmosphere is enclosed within the three-dimensional (3D) printer. The platen includes an inert metal. The platen is configured to have a feedstock deposited onto it. The control unit is configured to deposit a first layer of a neutral feedstock onto the platen of the three-dimensional (3D) printer. The neutral feedstock includes a halogenated solution and a nanoparticle having a negative electron affinity. The control unit is further configured to induce the nanoparticle of the neutral feedstock to emit solvated electrons into the halogenated solution using a laser to form, by reduction, a first layer of a neutral ceramic. The control unit is also configured to deposit a second layer of a p-type feedstock onto the platen of the three-dimensional (3D) printer. The p-type feedstock includes a boronated compound introduced into the neutral feedstock. The control unit is further configured to induce the nanoparticle of the p-type feedstock to emit solvated electrons into the halogenated solution using the laser to form, by reduction, a second layer of a p-doped ceramic. The control unit is also configured to deposit a third layer of an n-type feedstock onto the platen of the three-dimensional (3D) printer. The n-type feedstock includes a phosphorous compound introduced into the neural feedstock. The control unit is further configured to induce the nanoparticle of the n-type feedstock to emit solvated electrons into the halogenated solution using the laser to form, by reduction, a third layer of an n-doped ceramic.

Technical advantages of certain embodiments may include using alternating layers of neutral, p-doped, and n-doped feedstocks of negative electron affinity nanoparticle with halogenated solution to form a ceramic semiconductor without a greenware intermediary that requires heating with a kiln to form a final ceramic. Some embodiments may include forming a diamond semiconductor. Other embodiments may include forming a silicon carbide ceramic semiconductor. Other technical advantages will be readily apparent to one skilled in the art from the following figures, descriptions, and claims. Moreover, while specific advantages may have been enumerated above, various embodiments may include all, some, or none of the enumerated advantages.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION

Figure 1:
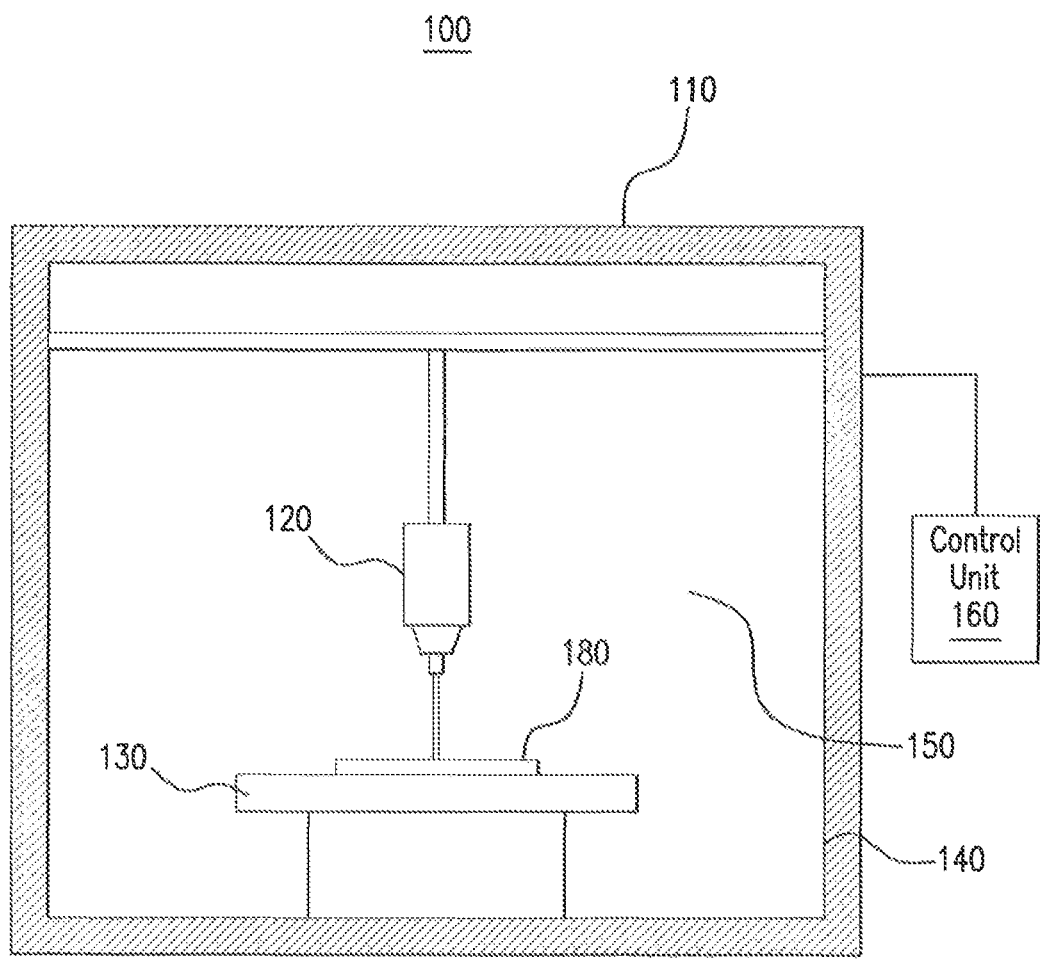
FIG. 1 illustrates an example of a 3D printer, according to certain embodiments.

Embodiments of the present disclosure and its advantages are best understood by referring to FIGS. 1 through 4, like numerals being used for like and corresponding parts of the various drawings.

Current techniques of 3D printing ceramics require use of a preceramic polymer or ceramic particles plus binder to create a greenware intermediary. The greenware intermediary requires heating, often through use of a kiln, to thermolyze or sinter into a final ceramic. Heating the greenware intermediary in the kiln causes shrinkage, which must be anticipated during the design of the product.

In order to eliminate the greenware intermediary that requires heating in the kiln, embodiments of the present disclosure include 3D printing a ceramic by inducing a negative electron affinity nanoparticle in a halogenated solution to emit electrons, where the reduced halogenated compound nucleates directly form the ceramic. By 3D printing a ceramic with a negative electron affinity nanoparticle and a halogenated solution, the ceramic may be formed without the greenware intermediary that requires baking in a kiln. The 3D printing with a negative electron affinity nanoparticle and halogenated solution also avoids contaminant in the form of a catalyst or binder, because the nanoparticle is incorporated directly into the ceramic product. Embodiments of the present disclosure may also include forming a 3D ceramic of arbitrary shape at room temperature or lower.

Diamond is a form of the element carbon that has many unique properties. Diamond is among the hardest known materials, has a high melting and boiling point, and is an excellent thermal conductor as well as electrical insulator. Objects made out of diamond may be able to take advantage of these properties. For example, tools made out of diamond, such as drill bits, saws, or knives, may be more durable than tools made of conventional materials due to the hardness of diamond. Diamond can be produced in a variety of ways including as a powder in the form of diamond nanoparticles and from the pyrolysis of a pre-ceramic polymer.

The teachings of this disclosure recognize that using three-dimensional (3D) printing techniques with a negative electron affinity nanoparticle and a halogenated solution may allow for the creation of objects made of a variety of ceramics in a variety of useful shapes. In particular, using 3D printing techniques with a negative electron affinity nanoparticle (for example, a hydrogen-terminated nanodiamond) and a halogenated solution (for example, carbon tetrachloride) may allow for the creation of diamond objects in a variety of shapes. For example, using 3D printing with a negative electron affinity nanoparticle (for example, a nanodiamond) and a halogenated solution (for example, carbon tetrachloride) may allow for the creation of a diamond drill bit having almost any geometry. As other examples, 3D printing with a negative electron affinity nanoparticle (for example, nanodiamond) and a halogenated solution (for example, carbon tetrachloride) may be used to print brake pad inserts, avionics boxes, lightweight armor, diamond dialysis filters, vacuum micro-electronics, or any other appropriate object.

Further, by using different negative electron affinity nanoparticles and halogenated solutions separately or in addition to nanodiamond or carbon tetrachloride, the properties of a printed object could be varied to meet various design objectives. For example, in addition to forming diamond objects, embodiments of the present disclosure may form objects made of other carbides, such as silicon carbide, titanium carbide, hafnium carbide, vanadium carbide, or tungsten carbide.

The teachings of this disclosure recognize that alternating layers of neutral, p-type, and n-type feedstock of negative electron affinity nanoparticle and halogenated solution may be used to 3D print a ceramic semiconductor, without the need to form a greenware intermediary that requires heating in a kiln. For example, ceramic semiconductors that may be 3D printed according to the present disclosure include semiconducting diamond and/or semiconducting silicon carbide.

Further, the teachings of this disclosure recognize that a negative electron affinity nanoparticle and halogenated solution may be used to 3D print a final ceramic, without the need to form a greenware intermediary that requires heating with a kiln. In addition, the teachings of this disclosure recognize that use of a negative electron affinity nanoparticle may act as a pseudocatalyst that is incorporated into the final ceramic, without the need for using a catalyst or binder that would need to be recovered or extracted after the 3D printing is complete. The following describes methods and systems of 3D printing using a negative electron affinity nanoparticle with a halogenated solution.

Figure 2A:
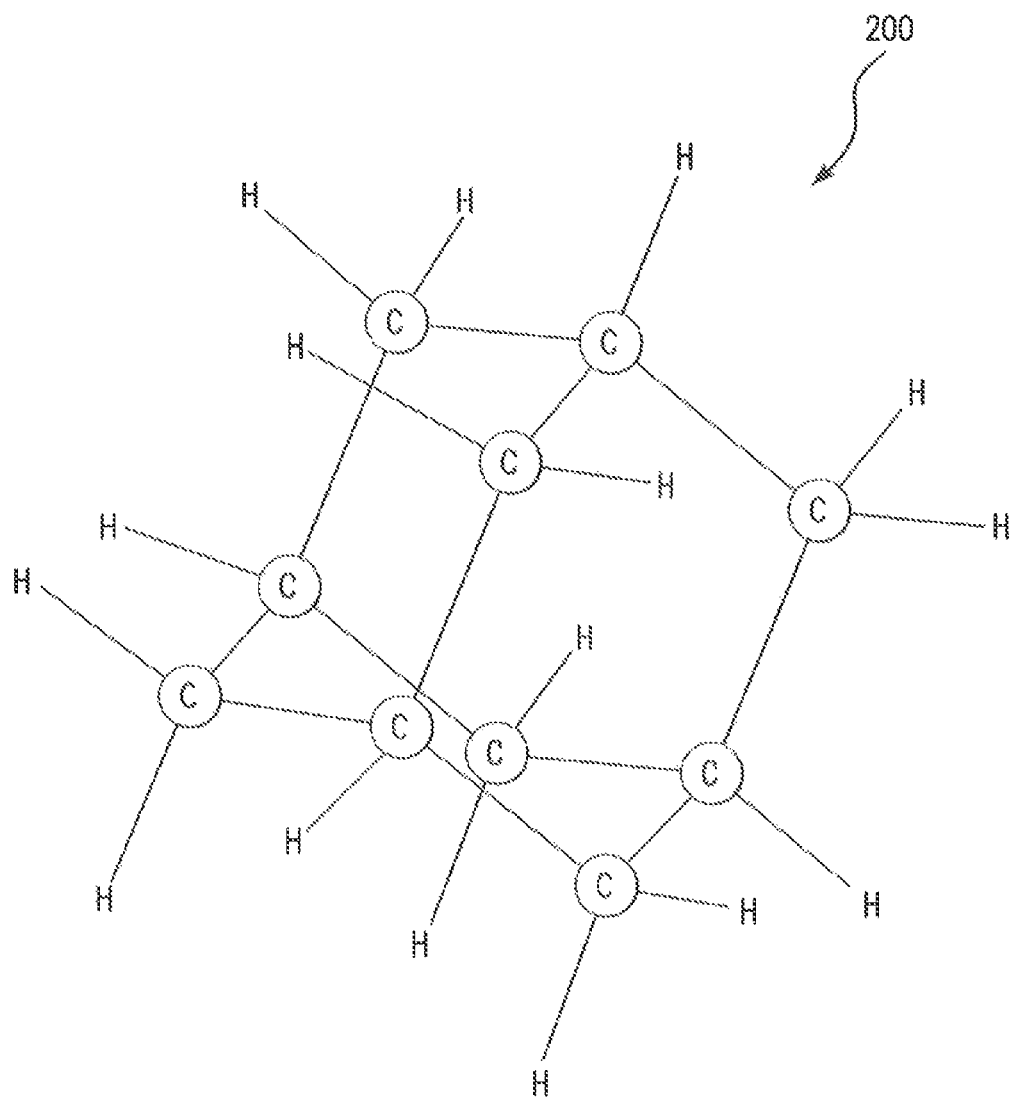
FIG. 2A illustrates the chemical structure of adamantane diamondoid, an example negative electron affinity nanoparticle according to certain embodiments.
Figure 2B:
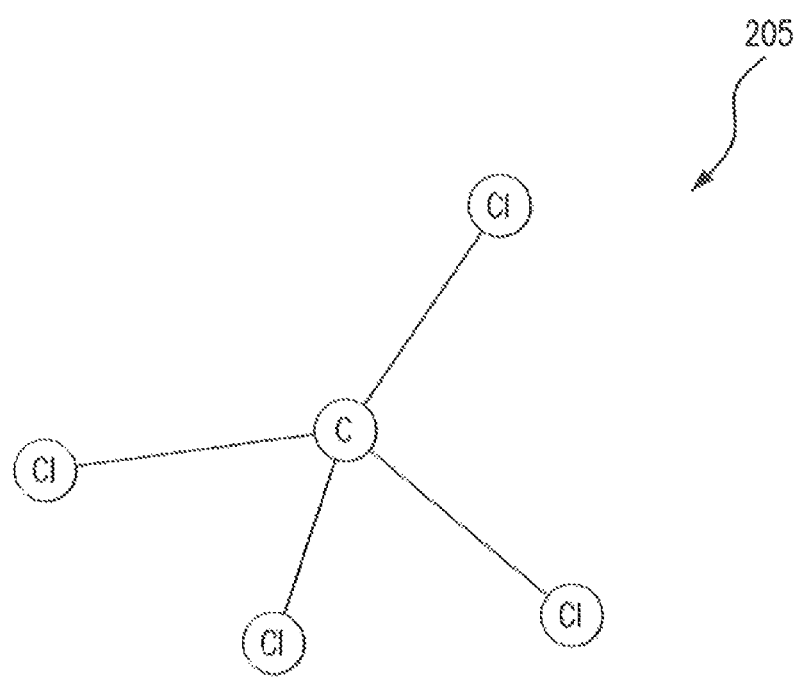
FIG. 2B illustrates the chemical structure of carbon tetrachloride, an example halogenated solution, according to certain embodiments.
Figure 2C:
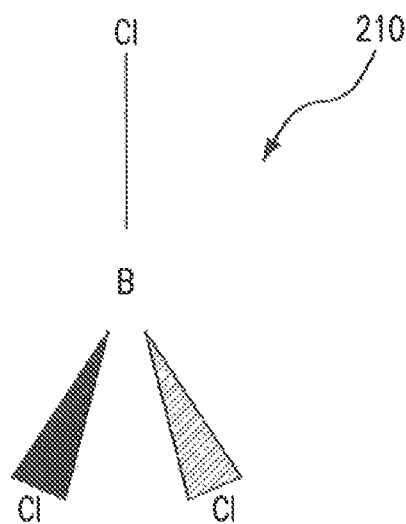
FIG. 2C illustrates the chemical structure of boron trichloride, an example boronated compound according to certain embodiments.
Figure 2D:
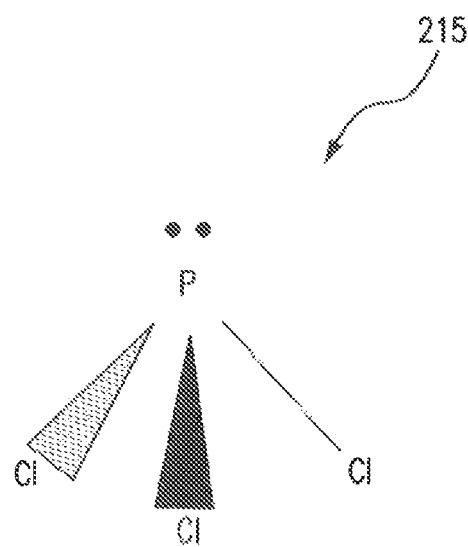
FIG. 2D illustrates the chemical structure of phosphorous trichloride, an example phosphorous compound, according to certain embodiments.
Figure 3:
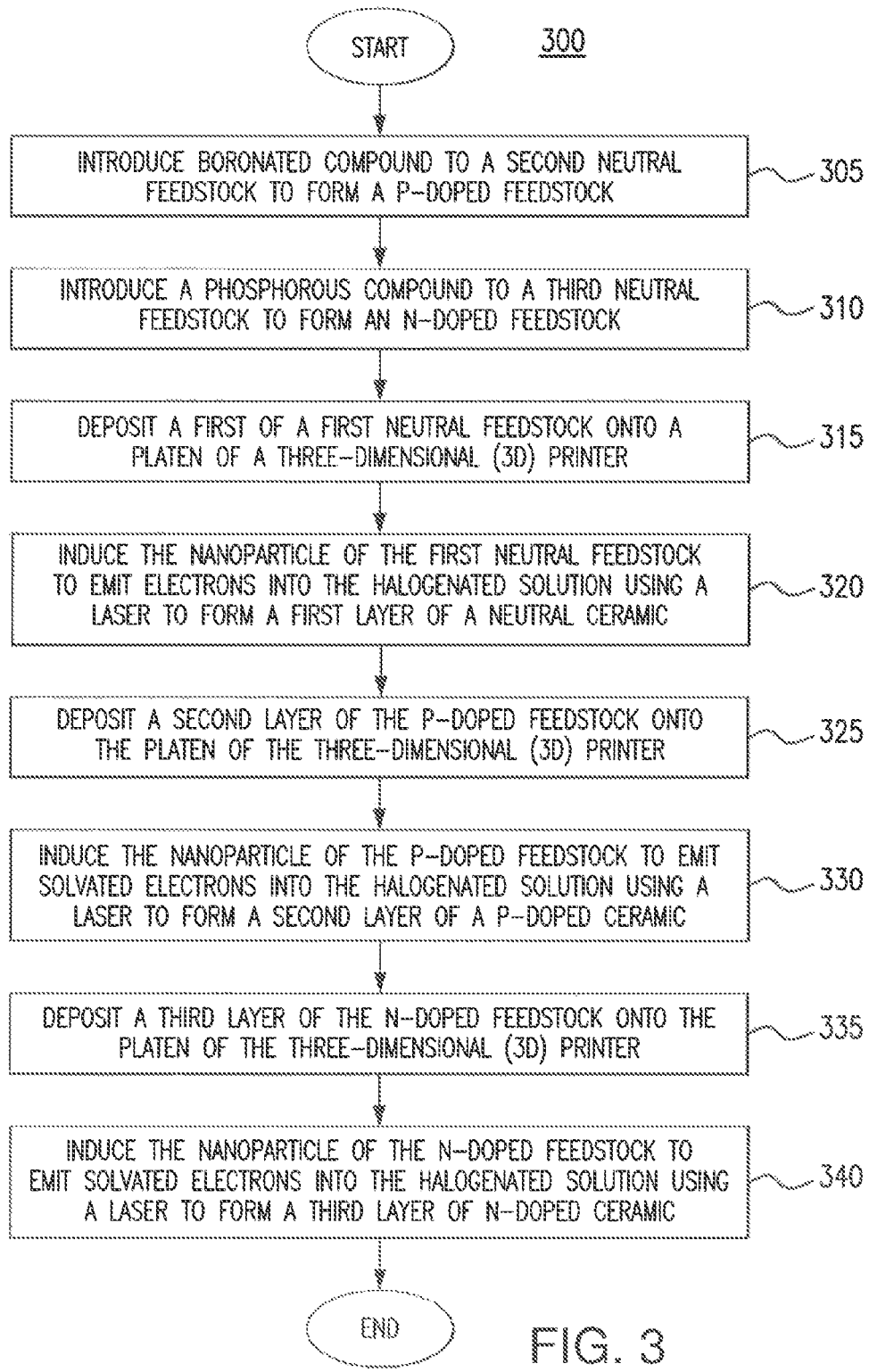
FIG. 3 illustrates a method of additive manufacture, according to certain embodiments.
Figure 4:
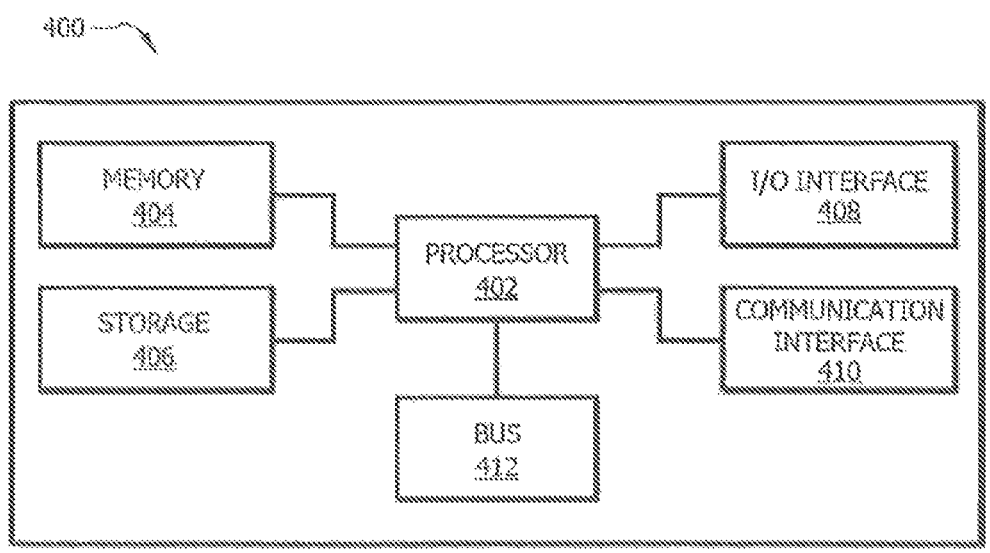
FIG. 4 illustrates an example computer system that may be used to control the 3D printer of FIG. 1, according to certain embodiments.

The system will be described in more detail using FIGS. 1 through 4. FIG. 1 will describe an example of a 3D printer system 100, according to certain embodiments. FIG. 2A will describe the chemical structure of an example negative electron affinity nanoparticle, adamantane diamondoid 200, according to certain embodiments. FIG. 2B will describe the chemical structure of an example halogenated solution, carbon tetrachloride 205, according to certain embodiments. FIG. 2C will describe an example boronated compound, boron trichloride, according to certain embodiments. FIG. 2D will describe an example phosphorous compound, phosphorous trichloride, according to certain embodiments. FIG. 3 will describe a method of additive manufacture, using a negative electron affinity nanoparticle with a halogenated solution, according to certain embodiments. FIG. 4 will describe an example computer system that may be used to control the 3D printer of FIG. 1, according to certain embodiments.

FIG. 1 illustrates an example 3D printer system 100. 3D printer system 100 includes 3D printer 110 and laser 120. 3D printer 110 includes platen 130 and enclosure 140. Platen 130 is a plate of inert material. For example, platen 130 may include platinum. Layers of feedstock 180 may be deposited onto platen 130 without reacting with platen 130. Feedstock 180 includes a negative electron affinity nanoparticle, such as adamantane diamondoid 200, and a halogenated solution, such as carbon tetrachloride 205. Enclosure 140 surrounds platen 130 and encloses an inert atmosphere 150. Examples of inert atmosphere 150 include nitrogen or argon gas. Enclosure 140 may maintain an inert 3D printing environment.

Laser 120 is configured to raster scan feedstock 180 deposited on platen 130 to induce solvated electrons from the negative electron affinity nanoparticle, such as adamantane diamondoid 200. Laser 120 may emit wavelengths in the UV range. Laser 120 may also emit wavelengths in the visible light range. Laser 120 may induce a negative electron affinity nanoparticle in feedstock 180 to emit electrons into the halogenated solution, such as carbon tetrachloride 205. The electrons may reduce the halogen solution of feedstock 180 to form a diatomic halogen gas or liquid and an atom, such as a carbon atom. The carbon atom may nucleate into a ceramic, such as a diamond. Laser 120 may be set to certain wavelength or wavelength range. For example, laser 120 may be set to a wavelength between 213 to 223 nm. As another example, laser 120 may be set to a wavelength of 532 nm. The wavelength or wavelength range may be the wavelength necessary to stimulate the emission of electrons from the negative electron affinity nanoparticle.

In some embodiments, 3D printer system 100 may include a control unit 160. Control unit 160 may include a computer system that controls the printing of an object by providing instructions to 3D printer 110. Control unit 160 may be either external to 3D printer 110 or incorporated into 3D printer 110. Certain embodiments of control unit 160 are discussed in more detail below with respect to FIG. 5.

In some embodiments, 3D printer system 100 may include a flushing mechanism 190 configured to flush inert atmosphere 150 in enclosure 140 and to recover byproduct released into enclosure 140. For example, in some embodiments a halogen gas byproduct may be released into enclosure 140. Flushing mechanism 190 may flush the halogen gas byproduct from inert atmosphere 150 of enclosure 140 and securely store the halogen gas byproduct. In this way, flushing mechanism 190 may ensure the halogen gas byproduct does not contaminate inert atmosphere 150. In this way, flushing mechanism 190 may also ensure the halogen gas byproduct is not released from 3D printing system 100 into the outside atmosphere.

Flushing mechanism 190 may use any conventional method of flushing necessary to remove halogen gas from enclosure 140 in a way that prevents release of halogen gas into the outside atmosphere. For example, flushing mechanism 190 may involve a continuous flow of argon gas through enclosure 140 and then through any conventional mechanism for recovering of halogen gas, such as by use of filters or compressors.

In some embodiments, 3D printer system 100 may include a draining mechanism 170 configured to drain feedstock 180. For example, when 3D printing of an object is complete, there may be leftover feedstock 180 on platen 130. Draining mechanism 170 may drain the leftover feedstock 180 on platen 130 into a storage tank. Draining mechanism 170 may use any conventional method of draining necessary to remove feedstock 180 from platen 130.

Feedstock 180 includes a halogenated solution, such as carbon tetrachloride 205. The halogenated solution, for example, may include bromine or chlorine as the halogen. It may be desirable to use a halogenated solution that is liquid at room temperature or at the temperature of the additive manufacture. For example, in embodiments forming a polycrystalline diamond ceramic, carbon tetrachloride or carbon tetrabromide may be liquid at room temperature. Other considerations in selecting a halogenated solution may also include the ease with which the diatomic halogen byproduct may be recovered. In some embodiments, it may be desirable for the other atoms of the halogenated solution to correspond with the atoms making up the ceramic product. For example, a halocarbon may be desirable as the halogenated solution when forming a polycrystalline diamond ceramic.

In embodiments forming a polycrystalline diamond ceramic, any halocarbon may be used as the halogenated solution. In such embodiments, carbon tetrachloride 205, as illustrated in FIG. 2B may be used. As another example, in such embodiments, carbon tetrabromide may be used in the halogenated solution. In other embodiments forming boron-nitride ceramics, (dichloroamine)dichloroborane ($NCl_2BCl_2$) may be used in the halogenated solution and nanoparticle boron nitride as the negative electron affinity nanoparticle.

In yet other embodiments forming a metal carbide ceramic, a metal or semi-metal halogen may be added to carbon tetrachloride 205. For example, in embodiments forming a silicon carbide ceramic, a halogenated solution containing carbon and silicon, such as trimethyltrichlorosilane (i.e., $CCl_6Si$), may be used. In embodiments forming a silicon carbide ceramic, the halogenated solution may include carbon tetrachloride 205 with the addition of silicon tetrachloride (i.e., $SiCl_4$). In embodiments forming a titanium carbide ceramic, the halogenated solution may include carbon tetrachloride 205 and titanium tetrachloride (i.e., $TiCl_4$). In embodiments forming a hafnium carbide ceramic, the halogenated solution may include carbon tetrachloride and hafnium tetrachloride (i.e., $HfCl_4$). In embodiments forming vanadium carbide, the halogenated solution may include carbon tetrachloride 205 and vanadium tetrachloride (i.e., $VCl_4$). In embodiments forming a tungsten carbide ceramic, the halogenated solution may include carbon tetrachloride and tungsten hexachloride (i.e., $WCl_6$).

In yet other embodiments, an n-doped feedstock and a p-doped feedstock may also be formed from the neutral feedstock. For example, carbon tetrachloride may be used as a neutral feedstock. A separate n-doped feedstock may be made by introducing a phosphorous compound, such as phosphorous trichloride 215, into the neutral feedstock. Additionally, a separate p-doped feedstock may be made by introducing a boronated compound, such as boron trichloride 210, into the neutral feedstock. In certain embodiments, a first layer of neutral feedstock and negative electron affinity nanoparticle may be introduced onto platen 130 of 3D printer 110. Laser 120 may induce the first layer to emit solvated electrons and form a first layer of neutral ceramic. A second layer of p-doped feedstock and negative electron affinity nanoparticle may be introduced onto platen 130 of 3D printer 110. Laser 120 may induce the second layer to emit solvated electrons and form a second layer of p-doped ceramic. A third layer of n-doped feedstock and negative electron affinity nanoparticle may be introduced onto platen 130 of 3D printer 110. Laser 120 may induce the third layer to emit solvated electrons and form a third layer of n-doped ceramic. This may be repeated until any desired number of layers are formed. For example, this may be repeated until 7 or 8 total layers are formed. This may form a ceramic semiconductor without the need for an intermediary greenware ceramic that requires thermolyzing in a kiln. The ceramic semiconductor may include a semiconducting diamond or a silicon carbide semiconductor.

Feedstock 180 also includes a negative electron affinity nanoparticle. Any negative electron affinity nanoparticle suitable to produce solvated electrons when induced by a laser, such as laser 120, may be used depending on the desired ceramic product. The negative electron affinity nanoparticle may act as a pseudocatalyst to produce electrons and nucleate into the ceramic.

In embodiments forming a polycrystalline diamond ceramic, any diamondoid or hydrogen-terminated nanodiamond may be used as the negative electron affinity nanoparticle of feedstock 180. For example in such embodiments, adamantane diamondoid 200 as illustrated in FIG. 2A may be used. Other examples of negative electron affinity nanoparticles that may be used in forming polycrystalline diamond ceramic include diamantane and tetramantae. The nanodiamond or diamondoid emits electrons when illuminated by a laser, such as laser 120. The reduced halocarbon then nucleates on nanodiamond or diamondoid to form diamond in $sp^3$ form. In this way, polycrystalline diamond ceramic is formed without the intermediary greenware, and without the need to heat an intermediary greenware in a kiln to form a final ceramic.

In embodiments forming a silicon carbide ceramic, an example negative electron affinity nanoparticle may include hydrogen-terminated silicon carbide nanoparticle. In yet other embodiments forming a boron nitride ceramic, negative electron affinity boron-nitride nanoparticles may be used.

FIG. 2A illustrates the chemical structure of adamantane diamondoid 200 (i.e., $C_{10}H_{16}$), which may be used as a negative electron affinity nanoparticle of feedstock 180 in certain embodiments forming a polycrystalline diamond.

FIG. 2B illustrates the chemical structure of carbon tetrachloride 205 (i.e., $CCl_4$), which may be used as a halogenated solution, according to certain embodiments.

FIG. 2C illustrates the chemical structure of boron trichloride 210, which may be used as a boronated compound. The boronated compound may be introduced to the feedstock to form a p-type feedstock.

FIG. 2l illustrates the chemical structure of phosphorous trichloride 215, which may be used as a phosphorous compound. The phosphorous compound may be introduced to the feedstock to form an n-type feedstock.

Figure 2E:
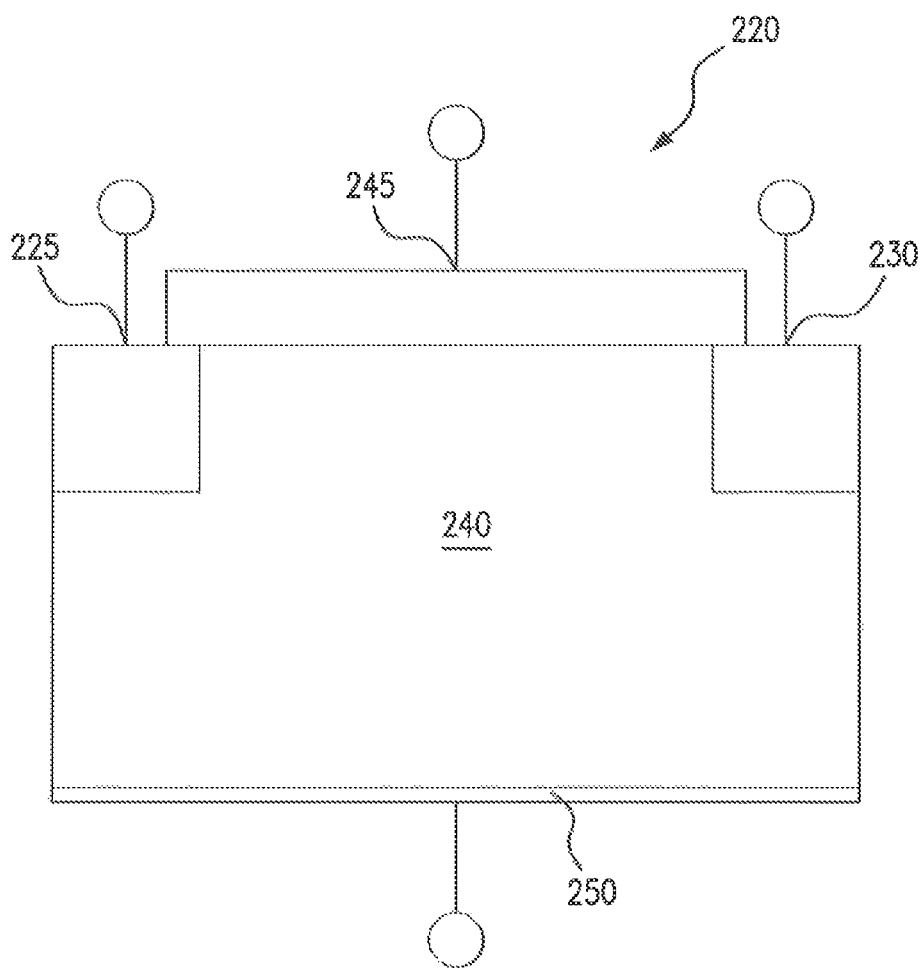
FIG. 2E illustrates an example semiconductor, according to certain embodiments.

FIG. 2E illustrates an example semiconductor 220, according to certain embodiments. Semiconductor 220 is an example semiconductor formed in certain embodiments, such as a field effect transistor (PET). Semiconductor 220 may be formed by performing method 300. Semiconductor 220 includes a source 225, a drain 230, a p-type substrate 240, a gate 245, and a body 250. Source 225 includes n-doped ceramic. Drain 230 includes n-doped ceramic. P-type substrate 240 includes p-doped ceramic. Gate 245 may be made of any conductive material suitable for carrying current. An insulator, such as a neutral diamond film, may separate gate 245 from p-type substrate 240. Body 250 is a base or substrate containing source 225 and drain 230. When current is applied to gate 245, electrons or current may flow from source 225 to drain 230.

FIG. 3 illustrates a method 300 for additive manufacture using a negative electron affinity nanoparticle and a halogenated solution. Method 300 may be implemented by 3D printer 110. Method 300 begins at step 305 where a boronated compound, such as boron trichloride 210, is introduced to a second neutral feedstock to form a p-doped feedstock.

At step 310, a phosphorous compound, such as phosphorous trichloride 215, is introduced to a third neutral feedstock to form an n-doped feedstock.

At step 315, a first layer of a first neutral feedstock is deposited onto platen 130 of 3D printer 110.

The first, second, and third neutral feedstock comprise a halogenated solution and a nanoparticle having a negative electron affinity.

At step 320, laser, such as laser 120, induces the nanoparticle of the first neutral feedstock to emit solvated electrons into the halogenated solution to form a first layer of a neutral ceramic. The laser inducing the nanoparticle to emit solvated electrons into the halogenated solution may also form a diatomic halogen.

At step 325, a second layer of the p-doped feedstock is deposited onto platen 130 of 3D printer 110.

At step 330, laser, such as laser 120, induces the nanoparticle of the p-doped feedstock to emit solvated electrons into the halogenated solution to form a second layer of a p-doped ceramic. The laser inducing the nanoparticle to emit solvated electrons into the halogenated solution may also form a diatomic halogen.

At step 335, a third layer of the n-doped feedstock is deposited onto platen 130 of 3D printer 110.

At step 340, laser, such as laser 120, induces the nanoparticle of the n-doped feedstock to emit solvated electrons into the halogenated solution to form a third layer of an n-doped ceramic. The laser inducing the nanoparticle to emit solvated electrons into the halogenated solution may also form a diatomic halogen.

When all layers have been formed, method 300 no longer proceeds back to step 305. For example, method 300 may no longer proceed back to step 305 after seven or eight layers have been formed. In some embodiments, excess feedstock 180 may be drained from the platen, such as platen 130, and into a storage tank or into a disposal tank.

In embodiments of method 300, the first layer of the neutral ceramic, the second layer of the p-doped ceramic, and the third layer of the n-doped ceramic form a ceramic semiconductor. Examples of the ceramic semiconductors that may be formed by method 300 include a silicon carbide semiconductor or a polycrystalline diamond semiconductor. In other embodiments of method 300, a ceramic semiconductor is formed without a kiln.

After printing, the object may be subjected to additional processing steps to prepare the object for use. Examples of post-printing processing may include: painting the object, polishing the object, treating the surface of the object to render it chemically inert or to make it chemically active, and assembly of another object or device from multiple printed objects.

Modifications, additions, or omissions may be made to method 300 depicted in FIG. 3. Method 300 may include more, fewer, or other steps. For example, steps may be performed in parallel or in any suitable order. While discussed as various components of system 100 performing the steps, any suitable component or combination of components of system 100 may perform one or more steps of the method.

FIG. 4 illustrates an example computer system 400 that may be used by the system of FIG. 1, according to certain embodiments. One or more computer systems 400 perform one or more steps of one or more methods described or illustrated herein. In particular embodiments, one or more computer systems 400 provide functionality described or illustrated herein. In particular embodiments, software running on one or more computer systems 400 performs one or more steps of one or more methods described or illustrated herein or provides functionality described or illustrated herein. Particular embodiments include one or more portions of one or more computer systems 400. Herein, reference to a computer system may encompass a computing device, and vice versa, where appropriate. Moreover, reference to a computer system may encompass one or more computer systems, where appropriate.

This disclosure contemplates any suitable number of computer systems 400. This disclosure contemplates computer system 400 taking any suitable physical form. As example and not by way of limitation, computer system 400 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 400 may include one or more computer systems 400; be unitary or distributed; span multiple locations; span multiple machines; span multiple data centers; or reside in a cloud, which may include one or more cloud components in one or more networks. Where appropriate, one or more computer systems 400 may perform without substantial spatial or temporal limitation one or more steps of one or more methods described or illustrated herein. As an example and not by way of limitation, one or more computer systems 400 may perform in real time or in batch mode one or more steps of one or more methods described or illustrated herein. One or more computer systems 400 may perform at different times or at different locations one or more steps of one or more methods described or illustrated herein, where appropriate.

In particular embodiments, computer system 400 includes a processor 402, memory 404, storage 406, an input/output (I/O) interface 408, a communication interface 410, and a bus 412. Although this disclosure describes and illustrates a particular computer system having a particular number of particular components in a particular arrangement, this disclosure contemplates any suitable computer system having any suitable number of any suitable components in any suitable arrangement.

In particular embodiments, processor 402 includes hardware for executing instructions, such as those making up a computer program. As an example and not by way of limitation, to execute instructions, processor 402 may retrieve (or fetch) the instructions from an internal register, an internal cache, memory 404, or storage 406; decode and execute them; and then write one or more results to an internal register, an internal cache, memory 404, or storage 406. In particular embodiments, processor 402 may include one or more internal caches for data, instructions, or addresses. This disclosure contemplates processor 402 including any suitable number of any suitable internal caches, where appropriate. As an example and not by way of limitation, processor 402 may include one or more instruction caches, one or more data caches, and one or more translation lookaside buffers (TLBs). Instructions in the instruction caches may be copies of instructions in memory 404 or storage 406, and the instruction caches may speed up retrieval of those instructions by processor 402. Data in the data caches may be copies of data in memory 404 or storage 406 for instructions executing at processor 402 to operate on; the results of previous instructions executed at processor 402 for access by subsequent instructions executing at processor 402 or for writing to memory 404 or storage 406; or other suitable data. The data caches may speed up read or write operations by processor 402. The TLBs may speed up virtual-address translation for processor 402. In particular embodiments, processor 402 may include one or more internal registers for data, instructions, or addresses. This disclosure contemplates processor 402 including any suitable number of any suitable internal registers, where appropriate. Where appropriate, processor 402 may include one or more arithmetic logic units (ALUs); be a multi-core processor; or include one or more processors 402. Although this disclosure describes and illustrates a particular processor, this disclosure contemplates any suitable processor.

In particular embodiments, memory 404 includes main memory for storing instructions for processor 402 to execute or data for processor 402 to operate on. As an example and not by way of limitation, computer system 400 may load instructions from storage 406 or another source (such as, for example, another computer system 400) to memory 404. Processor 402 may then load the instructions from memory 404 to an internal register or internal cache. To execute the instructions, processor 402 may retrieve the instructions from the internal register or internal cache and decode them. During or after execution of the instructions, processor 402 may write one or more results (which may be intermediate or final results) to the internal register or internal cache. Processor 402 may then write one or more of those results to memory 404. In particular embodiments, processor 402 executes only instructions in one or more internal registers or internal caches or in memory 404 (as opposed to storage 406 or elsewhere) and operates only on data in one or more internal registers or internal caches or in memory 404 (as opposed to storage 406 or elsewhere). One or more memory buses (which may each include an address bus and a data bus) may couple processor 402 to memory 404. Bus 412 may include one or more memory buses, as described below. In particular embodiments, one or more memory management units (MMUs) reside between processor 402 and memory 404 and facilitate accesses to memory 404 requested by processor 402. In particular embodiments, memory 404 includes random access memory (RAM). This RAM may be volatile memory, where appropriate Where appropriate, this RAM may be dynamic PAM (DRAM) or static PAM (SRAM). Moreover, where appropriate, this PAM may be single-ported or multi-ported RAM. This disclosure contemplates any suitable PAM. Memory 404 may include one or more memories 404, where appropriate. Although this disclosure describes and illustrates particular memory, this disclosure contemplates any suitable memory.

In particular embodiments, storage 406 includes mass storage for data or instructions. As an example and not by way of limitation, storage 406 may include a hard disk drive (HDD), a floppy disk drive, flash memory, an optical disc, a magneto-optical disc, magnetic tape, or a Universal Serial Bus (USB) drive or a combination of two or more of these. Storage 406 may include removable or non-removable (or fixed) media, where appropriate. Storage 406 may be internal or external to computer system 400, where appropriate. In particular embodiments, storage 406 is non-volatile, solid-state memory. In particular embodiments, storage 406 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 406 taking any suitable physical form. Storage 406 may include one or more storage control units facilitating communication between processor 402 and storage 406, where appropriate. Where appropriate, storage 406 may include one or more storages 406. Although this disclosure describes and illustrates particular storage, this disclosure contemplates any suitable storage.

In particular embodiments, I/O interface 408 includes hardware, software, or both, providing one or more interfaces for communication between computer system 400 and one or more I/O devices. Computer system 400 may include one or more of these I/O devices, where appropriate. One or more of these I/O devices may enable communication between a person and computer system 400. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 408 for them. Where appropriate, I/O interface 408 may include one or more device or software drivers enabling processor 402 to drive one or more of these I/O devices. I/O interface 408 may include one or more I/O interfaces 408, where appropriate. Although this disclosure describes and illustrates a particular I/O interface, this disclosure contemplates any suitable I/O interface.

In particular embodiments, communication interface 410 includes hardware, software, or both providing one or more interfaces for communication (such as, for example, packet-based communication) between computer system 400 and one or more other computer systems 400 or one or more networks. As an example and not by way of limitation, communication interface 410 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 410 for it. As an example and not by way of limitation, computer system 400 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 400 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 400 may include any suitable communication interface 410 for any of these networks, where appropriate. Communication interface 410 may include one or more communication interfaces 410, where appropriate. Although this disclosure describes and illustrates a particular communication interface, this disclosure contemplates any suitable communication interface.

In particular embodiments, bus 412 includes hardware, software, or both coupling components of computer system 400 to each other. As an example and not by way of limitation, bus 412 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 412 may include one or more buses 412, where appropriate. Although this disclosure describes and illustrates a particular bus, this disclosure contemplates any suitable bus or interconnect.

The components of computer system 400 may be integrated or separated. In some embodiments, components of computer system 400 may each be housed within a single chassis. The operations of computer system 400 may be performed by more, fewer, or other components. Additionally, operations of computer system 400 may be performed using any suitable logic that may comprise software, hardware, other logic, or any suitable combination of the preceding.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Although the present disclosure includes several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method for additive manufacture, comprising:
  introducing a boronated compound to a second neutral feedstock to form a p-doped feedstock, wherein the neutral feedstock comprises a halogenated solution and a nanoparticle having a negative electron affinity;
  introducing a phosphorous compound to a third neutral feedstock to form an n-doped feedstock;
  depositing a first layer of a first neutral feedstock onto a platen of a three-dimensional (3D) printer;
  inducing the nanoparticle of the first neutral feedstock to emit solvated electrons into the halogenated solution using a laser to form, by reduction, a first layer of a neutral ceramic;
  depositing a second layer of the p-doped feedstock onto the platen of the three-dimensional (3D) printer;
  inducing the nanoparticle of the p-doped feedstock to emit solvated electrons into the halogenated solution using a laser to form, by reduction, a second layer of a p-doped ceramic;
  depositing a third layer of the n-doped feedstock onto the platen of the three-dimensional (3D) printer;
  inducing the nanoparticle of the n-doped feedstock to emit solvated electrons into the halogenated solution using a laser to form, by reduction, a third layer of n-doped ceramic.

2. The method of claim 1, wherein:
  the halogenated solution comprises carbon tetrachloride;
  the nanoparticle comprises nanodiamond.

3. The method of claim 2, wherein the first layer of the neutral ceramic, the second layer of the p-doped ceramic, and the third layer of the n-doped ceramic form a polycrystalline diamond semiconductor.

4. The method of claim 1, wherein:
  the halogenated solution comprises trichloromethyl-trichlorosilane;
  the nanoparticle comprises hydrogen-terminated silicon carbide nanoparticle.

5. The method of claim 4, wherein the first layer of the neutral ceramic, the second layer of the p-doped ceramic, and the third layer of the n-doped ceramic form a silicon carbide semiconductor.

6. The method of claim 2, wherein:
the boronated compound comprises boron trichloride; and
the phosphorous compound comprises phosphorous trichloride.

7. The method of claim 1, wherein the first layer of the neutral ceramic, the second layer of the p-doped ceramic, and the third layer of the n-doped ceramic form a ceramic semiconductor without a kiln.

* * * * *